(12) United States Patent
Mori

(10) Patent No.: US 9,711,597 B2
(45) Date of Patent: Jul. 18, 2017

(54) SEMICONDUCTOR ELEMENT, METHOD FOR MANUFACTURING SAME, AND SEMICONDUCTOR INTEGRATED CIRCUIT

(71) Applicant: NATIONAL INSTITUTE OF ADVANCED INDUSTRIAL SCIENCE AND TECHNOLOGY, Tokyo (JP)

(72) Inventor: Takahiro Mori, Ibaraki (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 14/915,546

(22) PCT Filed: Jul. 30, 2014

(86) PCT No.: PCT/JP2014/070053
§ 371 (c)(1),
(2) Date: Feb. 29, 2016

(87) PCT Pub. No.: WO2015/033706
PCT Pub. Date: Mar. 12, 2015

(65) Prior Publication Data
US 2016/0211325 A1    Jul. 21, 2016

(30) Foreign Application Priority Data

Sep. 4, 2013  (JP) .................................. 2013-182662
Nov. 13, 2013  (JP) .................................. 2013-234748

(51) Int. Cl.
*H01L 33/42* (2010.01)
*H01L 29/10* (2006.01)
(Continued)

(52) U.S. Cl.
CPC .... *H01L 29/1033* (2013.01); *H01L 21/02532* (2013.01); *H01L 29/161* (2013.01);
(Continued)

(58) Field of Classification Search
CPC ..... H01L 51/0072; H01L 51/56; H01L 43/08; C09K 11/06; C09K 11/025
(Continued)

(56) References Cited

U.S. PATENT DOCUMENTS 5,644,156 A   7/1997   Suzuki et al.
5,844,256 A   12/1998  Higashino
(Continued)

FOREIGN PATENT DOCUMENTS

CN   102142461 A    8/2011
DE   102011119497 A1   5/2013
(Continued)

OTHER PUBLICATIONS

Woo Young Choi, et al., "Tunneling Field-Effect Transistors (TFETs) With Subthreshold Swing (SS) Less Than 60mV/dec", IEEE Electron Device Letters, Aug. 2007, pp. 743 to 745, vol. 28-issue No. 8.
(Continued)

*Primary Examiner* — Andy Huynh
(74) *Attorney, Agent, or Firm* — Pergament & Cepeda LLP; Milagros A. Cepeda; Edward D. Pergament

(57) ABSTRACT

The present invention provides a semiconductor element that can be manufactured easily at a low cost, can obtain a high tunneling current, and has an excellent operating characteristic, a method for manufacturing the same, and a semiconductor integrated circuit including the semiconductor element. The semiconductor element of the present invention is characterized in that the whole or a part of a tunnel junction is constituted by a semiconductor region
(Continued)

made of an indirect-transition semiconductor containing isoelectronic-trap-forming impurities.

13 Claims, 12 Drawing Sheets

(51) Int. Cl.
| | |
|---|---|
| *H01L 29/739* | (2006.01) |
| *H01L 21/02* | (2006.01) |
| *H01L 29/161* | (2006.01) |
| *H01L 29/167* | (2006.01) |
| *H01L 29/66* | (2006.01) |
| *H01L 29/78* | (2006.01) |

(52) U.S. Cl.
CPC ...... *H01L 29/167* (2013.01); *H01L 29/66568* (2013.01); *H01L 29/7391* (2013.01); *H01L 29/78* (2013.01)

(58) Field of Classification Search
USPC .............................................................. 257/9
See application file for complete search history.

(56) References Cited

U.S. PATENT DOCUMENTS

| | | | |
|---|---|---|---|
| 2007/0178650 A1* | 8/2007 | Chen | H01L 29/165 438/301 |
| 2012/0199917 A1 | 8/2012 | Morooka | |
| 2013/0075830 A1 | 3/2013 | Miyano et al. | |

FOREIGN PATENT DOCUMENTS

| | | |
|---|---|---|
| EP | 1737033 A1 | 12/2006 |
| JP | 48-102990 A | 12/1973 |
| JP | 54-059891 A | 5/1979 |
| JP | 61-176153 A | 8/1986 |
| JP | 08-148280 A | 6/1996 |
| JP | 2003-273395 A | 9/2003 |
| JP | 2005-328029 A | 11/2005 |
| JP | 2006-147861 A | 6/2006 |
| JP | 2007-305748 A | 11/2007 |
| JP | 2012-164699 A | 8/2012 |
| WO | 96/33514 A1 | 10/1996 |
| WO | 2013/075690 A2 | 5/2013 |

OTHER PUBLICATIONS

International Search Report dated Nov. 4, 2014, for corresponding International Patent Application No. PCT/JP2014/070053. (With English Translation).

Written Opinion dated Nov. 4, 2014, for corresponding International Patent Application No. PCT/JP2014/070053. (With English Translation).

International Preliminary Report on Patentability issued on Mar. 8, 2016, for corresponding International Patent Application No. PCT/JP2014/070053.

G. Dewey, et al., "Fabrication, Characterization, and Physics of III-V Heterojunction Tunneling Field Effect Transistors (H-TFET) for Steep Sub-Threshold Swing", International Electron Devices Meeting Technical Digest, 2011, pp. 33.6.1 to 33.6.4.

Notice of Reasons for Rejection mailed by the Japanese Patent Office on Sep. 6, 2016, for corresponding Japanese Patent Application No. JP 2015-535383.

Extended European Search Report dated Feb. 20, 2017, for corresponding European Patent Application No. EP 14 84 2700.

Sheng S. Li, "Light-Emitting Devices", Semiconductor Physical Electronics, Oct. 20, 2005, pp. 459-514.

Michio Tajima and Yohei Kamata, "Quantification of Nitrogen in Silicon by Luminescence Activation Using Aluminum Ion Implantation", Japanese Journal of Applied Physics, Jul. 26, 2013, pp. 086602-1-086602-3, vol. 52, the Japan Society of Applied Physics.

Notice of Reasons for Refusal mailed by the Japanese Patent Office on Apr. 4, 2017, for corresponding Japanese Patent Application No. JP 2015-535383.

* cited by examiner

SEMICONDUCTOR ELEMENT, METHOD FOR MANUFACTURING SAME, AND SEMICONDUCTOR INTEGRATED CIRCUIT

This application is a National Phase application under 35 U.S.C. 371 of International Application No. PCT/JP2014/070053, filed on Jul. 30, 2014, which claims priority to Japanese Application Nos. 2013-182662, filed on Sep. 4, 2013, and 2013-234748, filed on Nov. 13, 2013, all of which are hereby incorporated by references in their entireties.

TECHNICAL FIELD

The present invention relates to a semiconductor element utilizing quantum tunneling as an operating principle, a method for manufacturing the same, and a semiconductor integrated circuit including the semiconductor element.

BACKGROUND ART

In recent years, efforts to save power consumption of LSI have become active. Among the efforts is to lower operating voltage. However, it is impossible to significantly lower the operating voltage of MOS transistors used in typical circuits due to physical limits. Hence, for saving power consumption of LSI, there is a demand for developing low-voltage switching devices that are based on an operating principle different from that of typical MOS transistors.

One example is tunneling field-effect transistors utilizing quantum tunneling between bands of a semiconductor. These transistors utilize quantum tunneling as an operating principle different from that of MOS transistors. Quantum tunneling is a phenomenon in which even electrons having energy that would not let the electrons pass over a potential barrier pass through the barrier to the opposite side at some percentage. It is said that the tunneling field-effect transistors can be operated by controlling a tunneling current, which passes through an energy barrier called tunnel barrier, by a gate voltage, and that the tunneling field-effect transistors can be operated at a lower voltage than typical MOS transistors (see, e.g., NPL 1).

However, a tunnel resistance in the tunneling field-effect transistors that defines the current magnitude of a tunneling current passing through the tunnel barrier is high. Therefore, a current (ON-state current) of the tunneling field-effect transistors during an ON state is low, and the tunneling field-effect transistors cannot be operated at a high speed. Hence, there have been proposed some methods for increasing the ON-state current.

For example, there is proposed a method for providing extremely high impurity concentrations in a source region and a drain region and suppressing the thickness of these regions to enable a steep impurity profile to be formed and increase a tunneling current (see PTL 1). However, even this method has not been able to increase a tunneling current to a practical use level.

There is also proposed a method for using a stepped semiconductor substrate to increase the area of a region in which quantum tunneling is to occur, to thereby increase a tunneling current (see PTL 2). However, this method has problems that a high manufacturing cost is required and that an operation becomes slower due to an increased capacity of a gate capacitor attributed to the area enlargement.

There is also proposed a method for using a direct-transition compound semiconductor as a material for forming a semiconductor layer to increase a tunneling current (see NPL 2). However, this method requires a new plant investment because manufacturing according to this method cannot be carried out in many of the existing plants, leading to a problem that a manufacturing cost is high.

Hence, there is currently no satisfactory semiconductor element available that can be manufactured easily at a low cost, can obtain a high tunneling current, and has an excellent operating characteristic.

To increase a tunneling current is a common object among semiconductor elements other than tunneling field-effect transistors, such as resonant tunneling diodes utilizing quantum tunneling and Esaki diodes.

CITATION LIST

Patent Literature

PTL 1: Japanese Patent Application Laid-Open (JP-A) No. 2006-147861
PTL 2: JP-A No. 2012-164699

Non-Patent Literature

NPL 1: W. Y. Choi et al., IEEE Electron Device Letters vol. 28, p. 743 (2007), "Tunneling Field-Effect Transistors (TFETs) with Subthreshold Swing (SS) Less Than 60 mV/dec"
NPL 2: G. Dewey et al., 2011 International Electron Devices Meeting Technical Digest, 33.6, "Fabrication, characterization, and physics of III-V heterojunction tunneling Field Effect Transistors (H-TFET) for steep sub-threshold swing"

SUMMARY OF INVENTION

Technical Problem

The present invention aims to solve the various related problems described above and achieve an object described below. That is, the present invention has an object to provide a semiconductor element that can be manufactured easily at a low cost, can obtain a high tunneling current, and has an excellent operating characteristic, a method for manufacturing the same, and a semiconductor integrated circuit including the semiconductor element.

Solution to Problem

Means for solving the problems described above are as follows.

In one aspect, the present invention provides a semiconductor element, including:
a tunnel junction,
wherein a whole or a part of the tunnel junction is constituted by a semiconductor region made of an indirect-transition semiconductor containing isoelectronic-trap-forming impurities.

In one variant, the present invention provides the semiconductor element according to the present invention wherein the indirect-transition semiconductor is silicon, germanium, or a mixed crystal of silicon and germanium.

In one variant, the present invention provides the semiconductor element according to the present invention, wherein the indirect-transition semiconductor is silicon, and the isoelectronic-trap-forming impurities are Al and N.

In one variant, the present invention provides the semiconductor element according to the present invention, wherein the tunnel junction is constituted by a PN junction.

In one variant, the present invention provides the semiconductor element according to the present invention, wherein the tunnel junction is constituted by a Schottky junction.

In one variant, the present invention provides the semiconductor element according to the present invention, wherein the semiconductor element has an element structure of a tunneling field-effect transistor in which a whole or a part of a tunnel junction is constituted by a semiconductor region made of an indirect-transition semiconductor containing isoelectronic-trap-forming impurities.

In another aspect, the present invention provides a method for manufacturing a semiconductor element, including:
a step of forming a semiconductor region made of an indirect-transition semiconductor into which isoelectronic-trap-forming impurities are incorporated, such that the semiconductor region constitutes a whole or a part of a tunnel junction of the semiconductor element.

In one variant, the present invention provides the semiconductor integrated circuit, including:
the semiconductor element according to the present invention.

In one variant, the present invention provides a method for manufacturing the semiconductor element according to the present invention,
wherein the indirect-transition semiconductor is silicon, germanium, or a mixed crystal of silicon and germanium.

In one variant, the present invention provides a method for manufacturing the semiconductor element according to the present invention,
wherein the indirect-transition semiconductor is silicon, and the isoelectronic-trap-forming impurities are Al and N.

In one variant, the present invention provides a method for manufacturing the semiconductor element according to the present invention,
wherein the tunnel junction is constituted by a PN junction.

In one variant, the present invention provides a method for manufacturing the semiconductor element according to the present invention,
wherein the tunnel junction is constituted by a Schottky junction.

In one variant, the present invention provides a method for manufacturing the semiconductor element according to the present invention,
wherein the semiconductor element comprises an element structure of a tunneling field-effect transistor in which a whole or a part of a tunnel junction is constituted by a semiconductor region made of an indirect-transition semiconductor that comprises isoelectronic-trap-forming impurities.

Advantageous Effects of Invention

The present invention can solve the various problems of the related arts described above, and can provide a semiconductor element that can be manufactured easily at a low cost, can obtain a high tunneling current, and has an excellent operating characteristic, a method for manufacturing the same, and a semiconductor integrated circuit including the semiconductor element.

DESCRIPTION OF EMBODIMENTS (Semiconductor Element and Method for Manufacturing Same)

A semiconductor element of the present invention contains isoelectronic-trap-forming impurities in a semiconductor region made of an indirect-transition semiconductor and constituting the whole or a part of a tunnel junction of the semiconductor element.

A method for manufacturing the semiconductor element of the present invention includes a step of forming the semiconductor region made of the indirect-transition semiconductor into which the isoelectronic-trap-forming impurities are incorporated, such that the semiconductor region constitutes the whole or a part of the tunnel junction of the semiconductor element.

This makes it possible to obtain a semiconductor element that can be manufactured easily at a low cost, can obtain a high tunneling current, and has an excellent operation characteristic.

Figure 1:
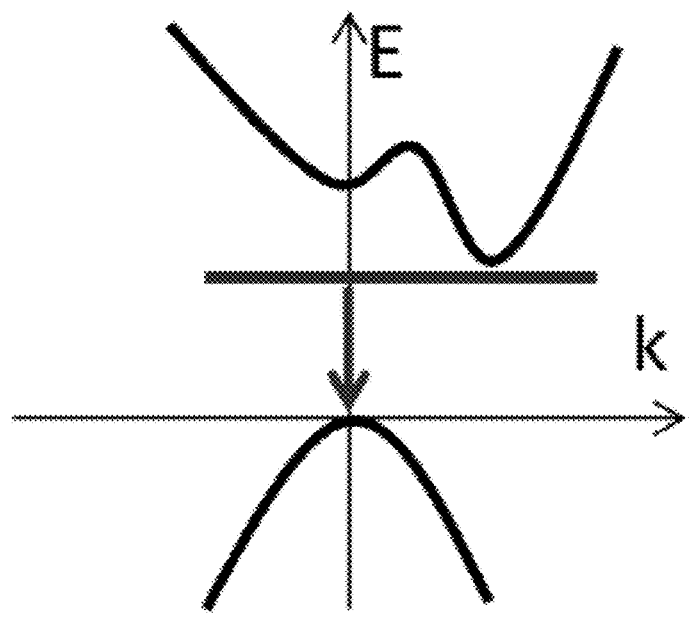
FIG. 1 is a diagram illustrating transition of electrons trapped at an impurity level from a conduction band to a valence band.

The most famous isoelectronic trap in semiconductors is one that is obtained by doping GaP, which is an indirect-transition semiconductor, with N. Seeing this as an example, N that is doped in GaP is substituted at the positions of P. Since N and P both belong to Group-V, N and P do not emit carriers and hence do not become a donor or an acceptor. However, N is greater than P in electronegativity indicating attractiveness for electrons. Therefore, around nitrogen atoms, it is easier to attract electrons. That is, as a neutral impurity, N functions as an isoelectronic trap for trapping electrons present in a conduction band. Since the electrons trapped at the impurity level of N are dispersed in the wavenumber space, the law of conservation of momentum is relaxed to enable these electrons to transition to a valence band. FIG. 1 is a band diagram of an indirect-transition semiconductor in which an impurity level is added, and illustrates transition of electrons trapped at the impurity level from a conduction band to a valence band. As illustrated in FIG. 1, the impurity level for trapping electrons as an isoelectronic trap enables transition of electrons to a valence band at any value of the wavenumber K.

Through this transition of electrons via the impurity level, electron transition between the conduction band and the valence band occurs at an increased probability even in an indirect-transition semiconductor, like electron transition in a direct-transition semiconductor. Utilizing this increasing phenomenon, GaP is applied as a light-emitting element configured to cause electrons in the conduction band to transition to the valence band and recombine with holes to intensify emission intensity.

Like the light emission phenomenon, quantum tunneling is a phenomenon that can be explained based on electron transition between the conduction band and the valence band. Because these phenomena are from the same cause, the formula representing the light emission probability and the formula representing the tunneling probability are very similar to each other, and both can be described by a so-called Fermi's golden rule relating to transition between the conduction band and the valence band.

Figure 2:
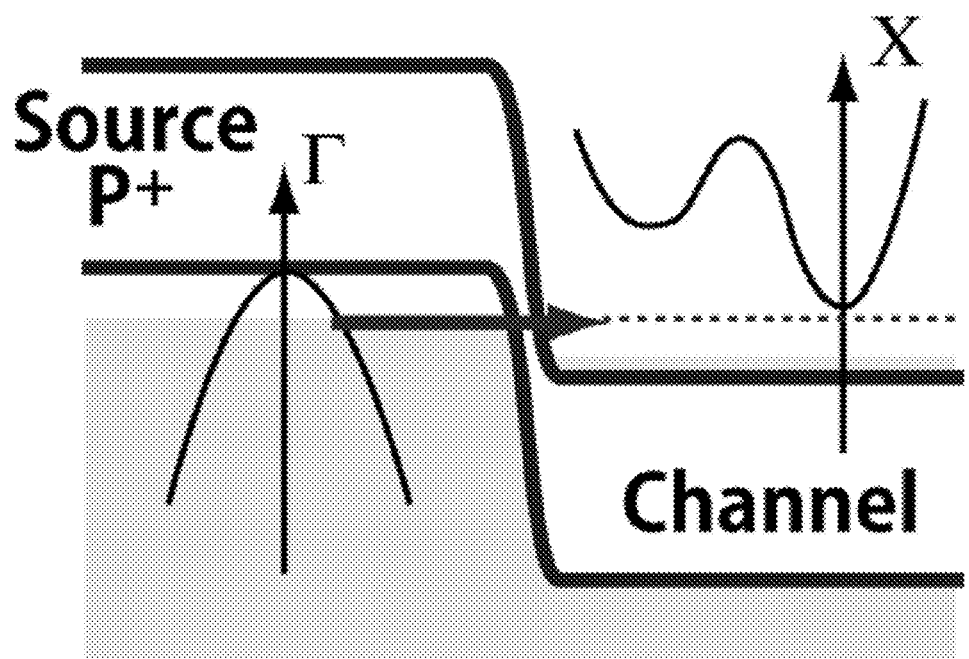
FIG. 2 is a diagram schematically illustrating how a tunneling current is intensified.

The principle lying in the intensification of the light emission phenomenon, which is from the same cause, is applied to the semiconductor element of the present invention in order to increase the tunneling probability. That is, by the whole or a part of the tunnel junction being constituted by the semiconductor region made of the indirect-transition semiconductor containing the isoelectronic-trap-forming impurities, the impurity level of the isoelectronic-trap-forming impurities is formed in a tunnel barrier generated in the tunnel junction, to increase electrons to pass through the tunnel barrier and intensify a tunneling current. FIG. 2 is a diagram schematically illustrating how a tunneling current is intensified in an N-type tunneling field-effect transistor, which is taken for example. The impurity level mentioned above is formed in the indirect-transition semiconductor in which the isoelectronic trap is formed, and a tunneling current based on transition of electrons trapped at the impurity level occurs and adds to a tunneling current passing through a tunnel barrier between a $P^+$-type source region and a channel region.

In this way, intensification of a tunneling current by the isoelectronic-trap-forming impurities is enabled in the semiconductor element of the present invention.

The indirect-transition semiconductor is not particularly limited, and an arbitrary indirect-transition semiconductor may be selected according to the purpose. However, silicon, germanium, or a mixed crystal of silicon and germanium is preferable, because these substances allow use of many of existing semiconductor facilities and meet the viewpoint of convenience and manufacturing cost saving. The semiconductor region made of the indirect-transition semiconductor may be constituted by a semiconductor substrate made of these substances.

A method for forming the tunnel barrier is not particularly limited, and the tunnel barrier may be formed according to a known forming method. For example, any of a PN junction, a Schottky junction, etc. that are based on known structures may be selected according to the kind of the semiconductor element to which it is applied.

The isoelectronic-trap-forming impurities are not particularly limited, and arbitrary isoelectronic-trap-forming impurities may be selected according to the indirect-transition semiconductor. That is, suitable isoelectronic-trap-forming impurities are those that are substituted in place of or bind with the indirect-transition semiconductor to trap carriers in the indirect-transition semiconductor. Examples of such impurities include impurities that are composed of a single element or two or more elements and do not themselves emit carriers.

Among such impurities, Al and N (group III-V compound semiconductor materials) are preferable when the indirect-transition semiconductor is silicon. C and Sn are preferable when the indirect-transition semiconductor is germanium. That is, these materials allow use of many of existing manufacturing facilities and enable easy and low-cost manufacturing of the semiconductor element.

The impurity concentration of the isoelectronic-trap-forming impurities to be incorporated into the semiconductor region is not particularly limited but is preferably from $1 \times 10^{16}$ cm$^{-3}$ through $1 \times 10^{20}$ cm$^{-3}$. When the impurity concentration is lower than $1 \times 10^{16}$ cm$^{-3}$, the impurities may not be able to cause a sufficient number of electrons to tunnel, thereby failing to intensify a current. When the impurity concentration is higher than $1 \times 10^{20}$ cm$^{-3}$, an impurity level may not be formed.

Figure 3A:
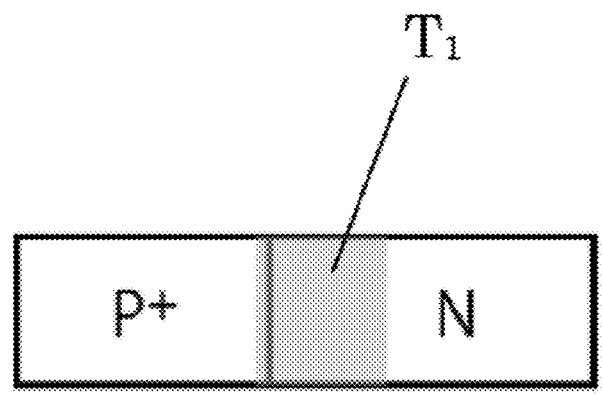
FIG. 3A is a diagram illustrating an example of how isoelectronic-trap-forming impurities are incorporated in a PN junction.

FIG. 3A illustrates an example of how the isoelectronic-trap-forming impurities are incorporated in the PN junction. In the incorporation example of FIG. 3A illustrating a semiconductor region constituted by a P-type region ($P^+$ region) and an N-type region, the isoelectronic-trap-forming impurities are incorporated in a region extending from the P-type region through the N-type region in a manner to include a portion that is located at the boundary between the P-type region and the N-type region and at which the tunnel junction is formed (region $T_1$).

Figure 3B:
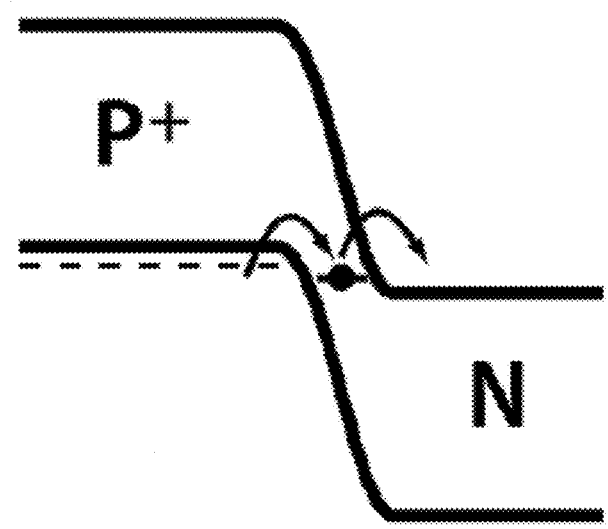
FIG. 3B is a diagram illustrating a band structure in the incorporation example of FIG. 3A.

At the PN junction formed in this manner, an impurity level by the isoelectronic-trap-forming impurities is formed in the tunnel barrier of the PN junction formed by the P-type region ($P^+$ region) and the N-type region as illustrated in the band structure of FIG. 3B, and electrons trapped at the impurity level are enabled to pass through the tunnel barrier.

Figure 4A:
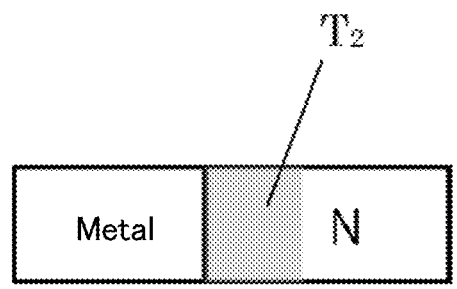
FIG. 4A is a diagram illustrating an example of how isoelectronic-trap-forming impurities are incorporated in a Schottky junction.

FIG. 4A illustrates an example of how the isoelectronic-trap-forming impurities are incorporated in the Schottky junction. In the incorporation example of FIG. 4A illustrating a metal region and an N-type semiconductor region, the isoelectronic-trap-forming impurities are incorporated in the semiconductor region in a manner to include a portion that is located at the boundary between the metal region and the semiconductor region and at which the tunnel junction is formed (region $T_2$).

Figure 4B:
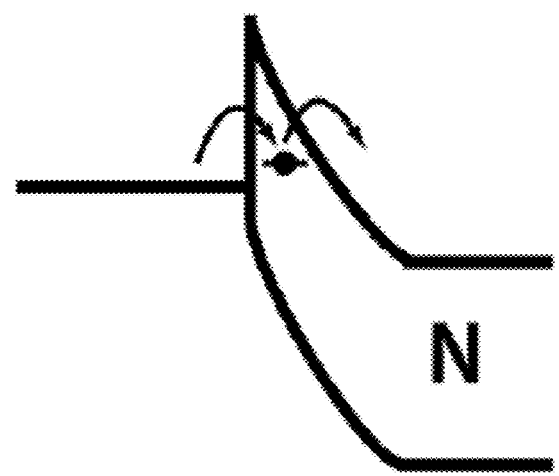
FIG. 4B is a diagram illustrating a band structure in the incorporation example of FIG. 4A.

At the Schottky junction formed in this manner, an impurity level by the isoelectronic-trap-forming impurities is formed in the tunnel barrier of the Schottky junction formed by the metal region and the semiconductor region as illustrated in FIG. 4B, and electrons trapped at the impurity level are enabled to pass through the tunnel barrier.

The semiconductor element is not particularly limited, and may be used as a wide variety of semiconductor elements utilizing quantum tunneling. For example, the semiconductor element can be used as semiconductor elements such as tunneling filed-effect transistors, resonant tunneling diodes, and Esaki diodes. The element structure of these semiconductor elements may be constituted based on known element structures of the intended semiconductor elements except that the isoelectronic-trap-forming impurities are incorporated in the element structure.

Figure 5:
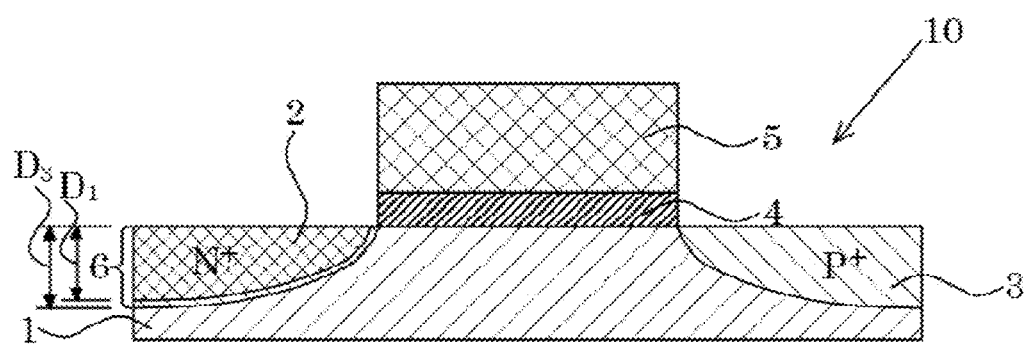
FIG. 5 is a depictive diagram depicting a tunneling field-effect transistor according to an embodiment of the present invention.

A configuration example of a tunneling field-effect transistor as an embodiment of the semiconductor element will be described with reference to FIG. 5.

A tunneling field-effect transistor 10 includes a source region 2, a channel region 1 that is disposed adjacent to the source region 2 and of which boundary with the source region 2 forms a tunnel junction at which a tunnel barrier is formed, a drain region 3 disposed adjacent to the channel region 1, and a gate electrode 5 disposed on the channel region 1 via a gate insulating film 4. The whole or a part of the tunnel junction is constituted by a semiconductor region 6 formed by incorporating the isoelectronic-trap-forming impurities into the source region 2 and the channel region 1. Here, the isoelectronic-trap-forming impurities are incorporated down to a position $D_3$ that is deeper than a forming depth $D_1$ down to which the source region 2 is formed, such that the semiconductor region 6 is formed to include the whole of the tunnel junction.

The configuration example illustrated here is a P-type tunneling field-effect transistor in which the source region 2 is an N-type ($N^+$) semiconductor region and the drain region 3 is a P-type ($P^+$) semiconductor region. For configuring an N-type tunneling field-effect transistor, the source region 2 is changed to a P-type semiconductor region and the drain region 3 is changed to an N-type semiconductor region.

The channel region 1 is constituted by a semiconductor substrate made of, for example, silicon and germanium. As the semiconductor substrate, it is preferable to use a semiconductor substrate having a single-crystal structure of these semiconductor materials that are intrinsic semiconductors or doped with an impurity material at a low concentration.

The source region 2 and the drain region 3 are formed by ion implantation of an impurity material into the semiconductor substrate. The impurity material for ion implantation is not particularly limited so long as the impurity material is a material that generates carriers in the source region 2 and the drain region 3. Typical examples of the impurity material include boron (B), phosphorus (P), and arsenic (As).

It is preferable that the concentration of the impurity material for ion implantation be a high concentration and from $1\times10^{19}$ cm$^{-3}$ through $1\times10^{21}$ cm$^{-3}$ from the viewpoint of effectively promoting narrowing of the width of the tunnel barrier when a gate field is applied.

A method for the ion implantation is not particularly limited and may be carried out according to a known ion implantation method. Examples of the method include a method for implanting the impurity material such as boron (B), phosphorus (P), and arsenic (As) into the semiconductor substrate using an ion source such as a boron difluoride ($BF_2$) gas, a phosphine ($PH_3$) gas, an arsine ($AsH_3$) gas, solid phosphorus, and solid arsenic.

After the ion implantation, it is preferable to perform activating annealing in order to activate the implanted impurity material. A method for the activating annealing is not particularly limited, and may be a known method. Examples of the method include a method using a halogen lamp for directly heating the semiconductor substrate with light from the lamp.

A method for forming the semiconductor region 6 into which the isoelectronic-trap-forming impurities are incorporated is not particularly limited, and examples of the method include ion implantation.

The isoelectronic-trap-forming impurities are as described above, and it is preferable to use Al and N when the semiconductor substrate is a silicon semiconductor substrate.

After the ion implantation, it is preferable to perform activating annealing in order to activate the isoelectronic-trap-forming impurities. A method for the activating annealing is not particularly limited, and may be a known method. Examples of the method include a method using a halogen lamp for directly heating the semiconductor substrate with light from the lamp.

A forming material for forming the gate insulating film 4 is not particularly limited, and an arbitrary material may be selected according to the purpose. Examples of the forming material include $HfO_2$, $Al_2O_3$, and $ZrO_2$.

A method for forming the gate insulating film 4 is not particularly limited, and an arbitrary method may be selected according to the purpose. Examples of the method include an ALD (Atomic Layer Deposition) method, a sputtering method, and a CVD (Chemical Vapor Deposition) method all using the forming material mentioned above.

A forming material for forming the gate electrode 5 formed on the gate insulating film 4 is not particularly limited, and an arbitrary material may be selected according to the purpose. Examples of the forming material include TiN, TaN, and NiSi.

A method for forming the gate electrode 5 is not particularly limited, and an arbitrary method may be selected according to the purpose. Examples of the method include a sputtering method and a CVD method both using the forming material mentioned above.

In the tunneling field-effect transistor 10 formed in this way, the width of the tunnel barrier between the source region 2 and the channel region 1 becomes narrow upon a gate field applied through the gate electrode 5, to cause electrons to pass through the tunnel barrier based on quantum tunneling to cause the tunneling current to flow between the source region 2 and the drain region 3 through a channel formed in the channel region 1.

Here, in the tunneling field-effect transistor 10, there occurs a simultaneous transition of electrons to pass over the tunnel barrier via the impurity level formed by the isoelectronic-trap-forming impurities present in the tunnel barrier. This makes it possible to intensify the tunneling current.

Figure 6:
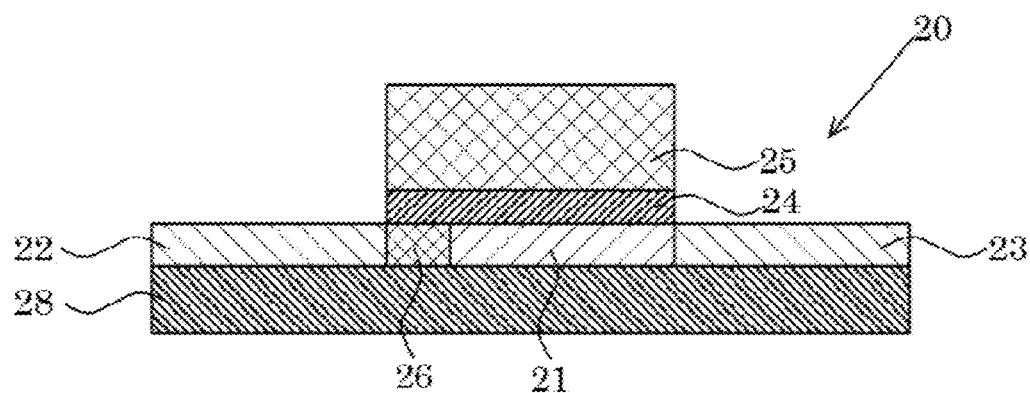
FIG. 6 is a depictive diagram depicting a tunneling field-effect transistor according to another embodiment of the present invention.

Next, a configuration example of a tunneling field-effect transistor as another embodiment of the semiconductor element will be described with reference to FIG. 6.

This tunneling field-effect transistor 20 has an element structure of a transistor based on a Schottky junction.

The tunneling field-effect transistor 20 includes a source electrode 22, a semiconductor channel region 21 that is disposed adjacent to the source electrode 22 and of which boundary with the source electrode 22 forms a tunnel junction at which a tunnel barrier is formed, a drain electrode 23 disposed adjacent to the channel region 21, an insulating substrate 28 supporting the channel region 21, the source electrode 22, and the drain electrode 23, and a gate electrode 25 disposed on the channel region 21 via a gate insulating film 24. The whole or a part of the tunnel junction is constituted by a semiconductor region 26 formed by incorporating the isoelectronic-trap-forming impurities into a part of the channel region 21. That is, in this tunneling field-effect transistor 20, the Schottky junction between the source electrode 22 and the channel region 21 is the tunnel junction.

For operating this tunneling field-effect transistor 20 as a P-type device, a metal having a work function greater than a work function of the channel semiconductor provided that the channel semiconductor is intrinsic is used as the source electrode. For operating the tunneling field-effect transistor 20 as an N-type device, a metal having a work function smaller than a work function of the channel semiconductor provided that the channel semiconductor is intrinsic is used as the source electrode.

The forming material for forming the source electrode 22 and the drain electrode 23 is not particularly limited, and an arbitrary material may be selected according to the purpose. Examples of the forming material include metal silicides such as $NiSi_2$ when the channel is made of silicon.

A method for forming the source electrode 22 and the drain electrode 23 is not particularly limited, and an arbitrary method may be selected according to the purpose. Examples of the method include a sputtering method and a CVD method both using the forming material mentioned above.

The insulating substrate 28 is not particularly limited, and an arbitrary insulating substrate may be selected according to the purpose. Examples of the insulating substrate include a $SiO_2$ substrate.

Description about the channel region 21, the gate insulating film 24, the gate electrode 25, and the semiconductor region 26 will not be provided, because these members can be constructed based on the matters mentioned in the description about the tunneling field-effect transistor 10 given above.

In the tunneling field-effect transistor 20 formed in this way, the width of the tunnel barrier between the source electrode 22 and the channel region 21 becomes narrow upon a gate field applied through the gate electrode 25, to cause electrons to pass through the tunnel barrier based on quantum tunneling to cause the tunneling current to flow between the source electrode 22 and the drain electrode 23 through a channel formed in the channel region 21.

Here, in the tunneling field-effect transistor 20, there occurs a simultaneous transition of electrons to pass over the tunnel barrier via the impurity level formed by the isoelectronic-trap-forming impurities present in the tunnel barrier. This makes it possible to intensify the tunneling current.

Next, an example of a method for manufacturing the tunneling field-effect transistor will be described with reference to FIG. 7A to FIG. 7K. This manufacturing method is according to an embodiment, which is to describe a simple, quick example of manufacturing the tunneling field-effect transistor. As a more practical manufacturing method, a known manufacturing method described in, e.g., JP-A No. 2012-204583 may be employed where appropriate.

First, a SOI wafer including in an order of reciting over a Si layer 107 for handling, a $SiO_2$ insulating layer (BOX layer) 108 having a thickness of 145 nm and a channel region 101 having a thickness of 50 nm and doped with a p-type impurity at about $1\times10^{15}$ $cm^{-3}$ is prepared.

Figure 7A:
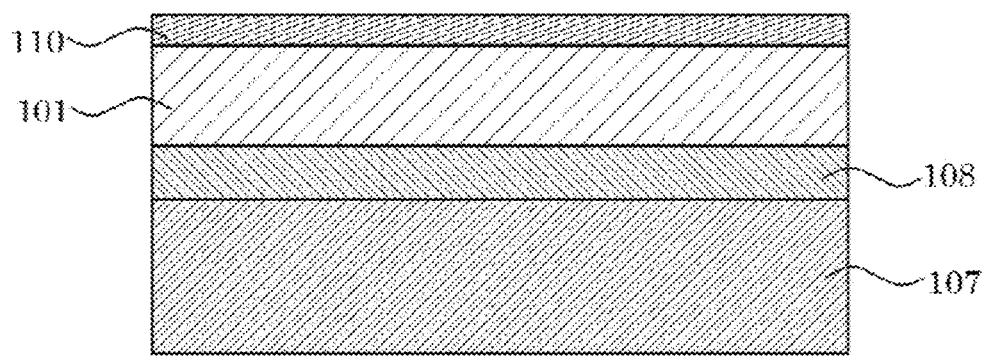
FIG. 7A is a diagram (1) illustrating an example of a step of manufacturing a tunneling field-effect transistor.

Next, a protective oxide film 110 is formed to have a thickness of 5 nm over the channel region 101 of the SOI wafer (see FIG. 7A).

Figure 7B:
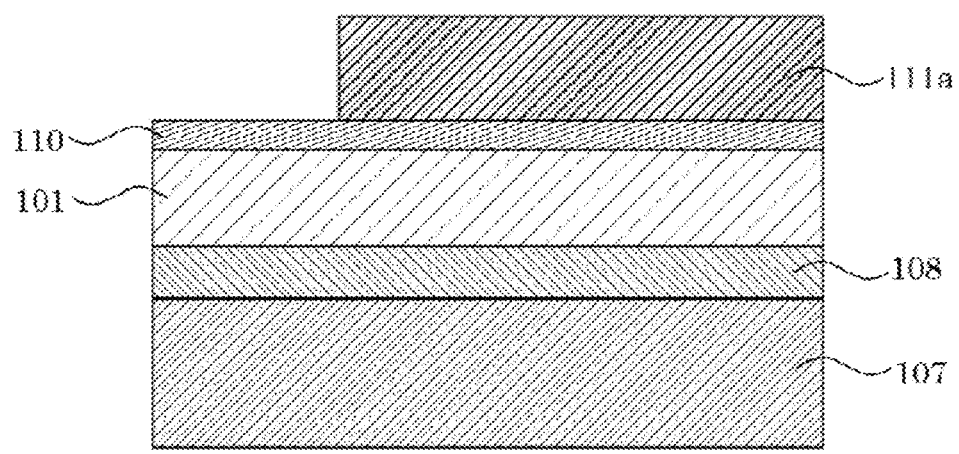
FIG. 7B is a diagram (2) illustrating an example of a step of manufacturing a tunneling field-effect transistor.

Next, a resist layer 111a having a thickness of 200 nm is formed over the protective oxide film 110 by electron beam lithography (see FIG. 7B).

Figure 7C:
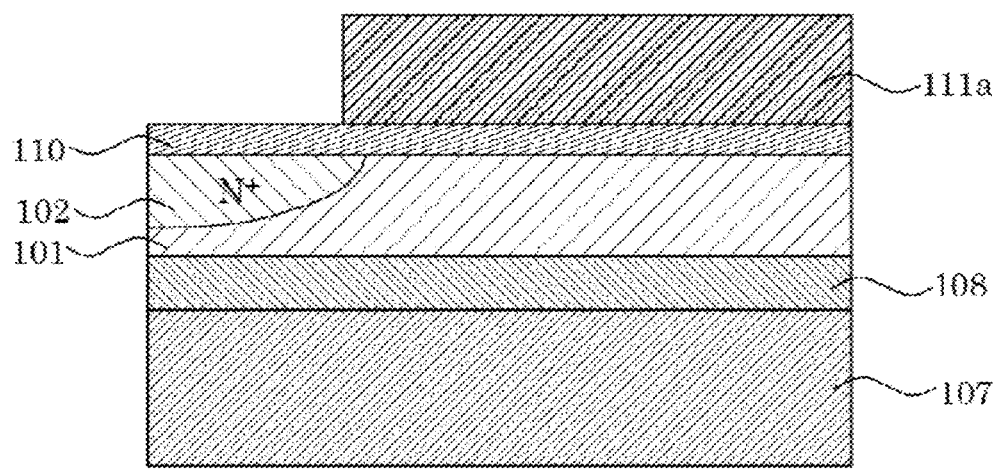
FIG. 7C is a diagram (3) illustrating an example of a step of manufacturing a tunneling field-effect transistor.

Next, using the resist layer 111a as a mask, ion implantation using As is performed at an acceleration energy of 5 keV at a dose of $2\times10^{15}$ $cm^{-2}$, to form a source region 102 in the channel region 101 (see FIG. 7C).

Figure 7D:
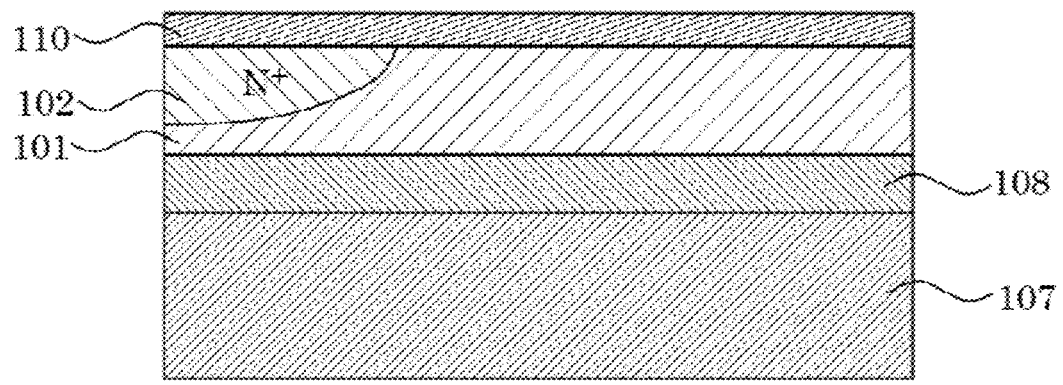
FIG. 7D is a diagram (4) illustrating an example of a step of manufacturing a tunneling field-effect transistor.

Next, the resist layer 111a is removed by an oxygen ashing treatment, and the surface is washed with a SPM (Sulfuric Acid Peroxide Mixture) (see FIG. 7D). In the SPM washing, the washing treatment is performed at a temperature of 120° C. using a 4:1 mixture of $H_2SO_4$ and $H_2SO_4$ as a washing liquid.

Figure 7E:
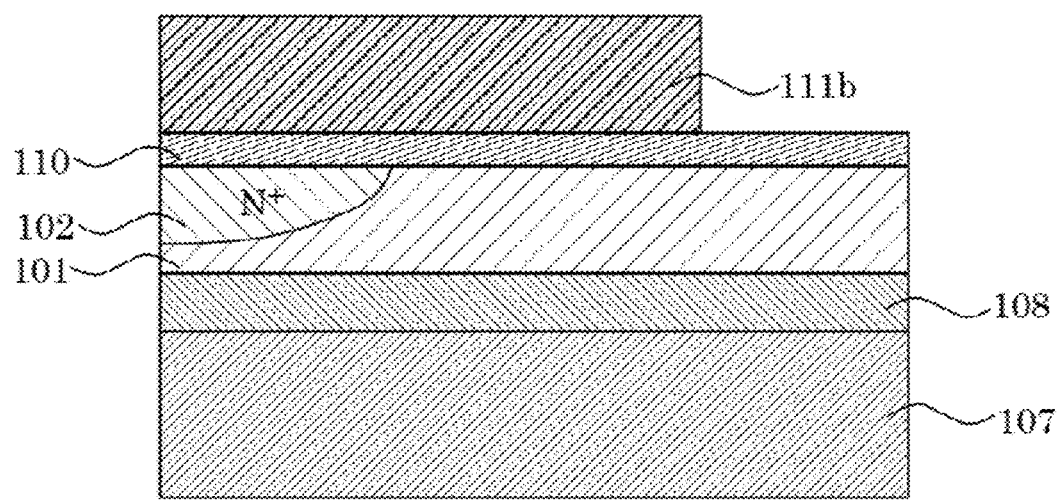
FIG. 7E is a diagram (5) illustrating an example of a step of manufacturing a tunneling field-effect transistor.

Next, a resist layer 111b having a thickness of 200 nm is formed over the protective oxide film 110 washed with the SPM (see FIG. 7E).

Figure 7F:
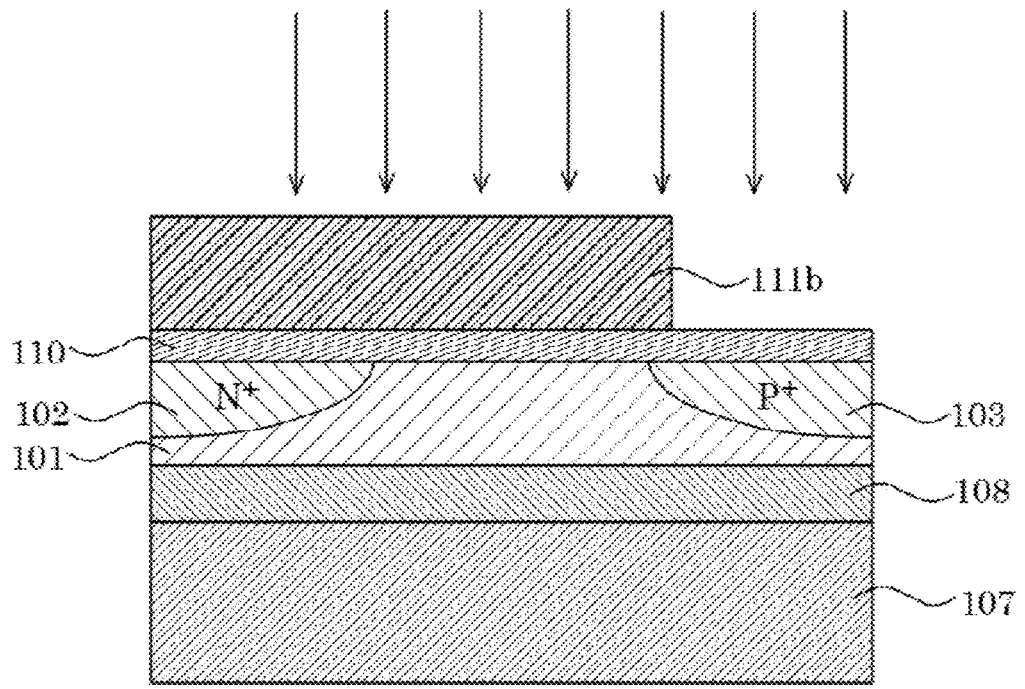
FIG. 7F is a diagram (6) illustrating an example of a step of manufacturing a tunneling field-effect transistor.

Next, using the resist layer 111b as a mask, ion implantation using $BF_2$ is performed at an acceleration energy of 5 keV at a dose of $2\times10^{15}$ $cm^{-2}$, to form a drain region 103 in the channel region 101 (see FIG. 7F).

Figure 7G:
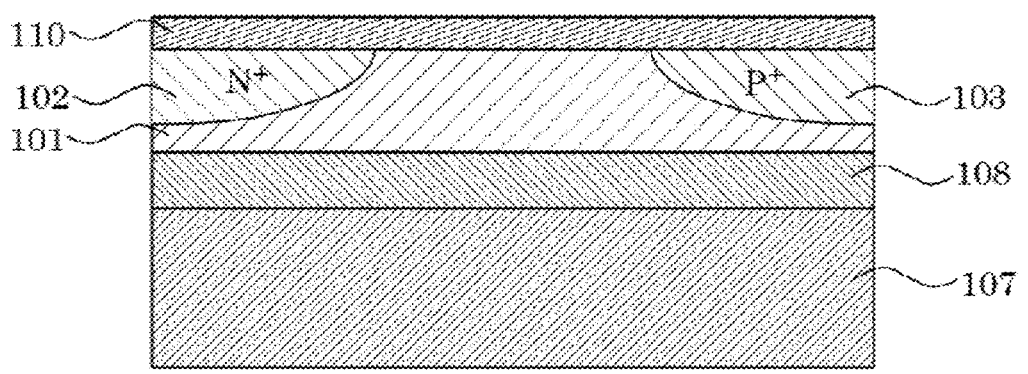
FIG. 7G is a diagram (7) illustrating an example of a step of manufacturing a tunneling field-effect transistor.

Next, the resist layer 111b is removed by an oxygen ashing treatment, and the surface is washed with a SPM (see FIG. 7G). In the SPM washing, the washing treatment is performed at a temperature of 120° C. using a 4:1 mixture of $H_2SO_4$ and $H_2SO_4$ as a washing liquid.

Next, an activating annealing treatment is performed under a $N_2$ gas atmosphere at an atmospheric air pressure at a temperature of 1,000° C. for 1 second, to activate the respective impurities in the source region 102 and the drain region 103.

Figure 7H:
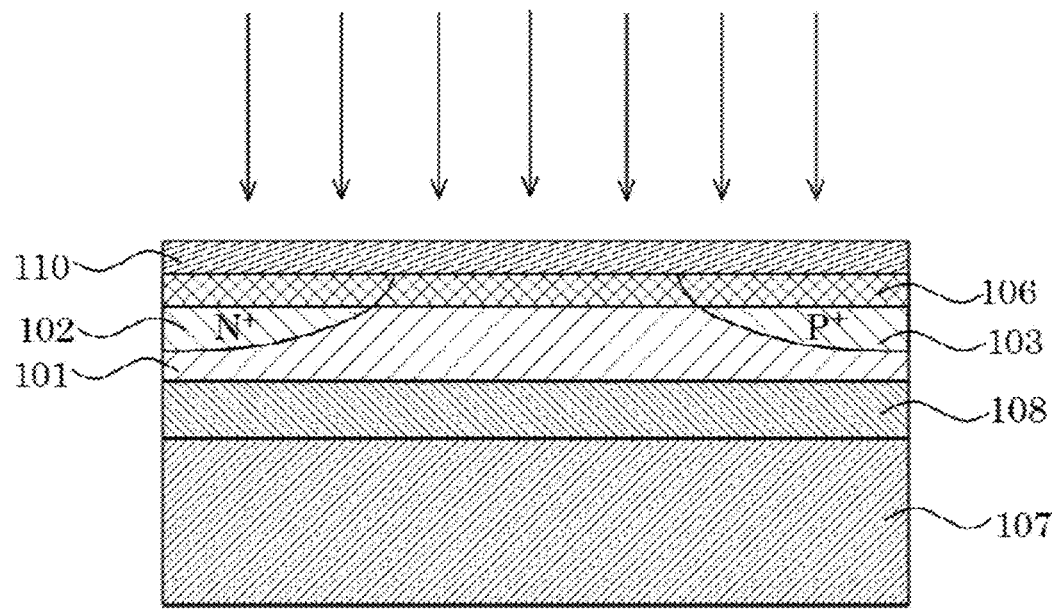
FIG. 7H is a diagram (8) illustrating an example of a step of manufacturing a tunneling field-effect transistor.

Next, from the protective oxide film 110 side, ion implantation of Al is performed at an acceleration energy of 15 keV at a dose of $5\times10^{13}$ $cm^{-2}$ and ion implantation of N is performed at an acceleration energy of 15 keV at a dose of $5\times10^{13}$ $cm^{-2}$, to form a semiconductor region 106 containing Al and N as isoelectronic-trap-forming impurities in a surface region of the source region 102, the channel region 101, and the drain region 103 (see FIG. 7H).

Next, an activating annealing treatment is performed under a $N_2$ gas atmosphere at an atmospheric air pressure at a temperature of 450° C. for 60 hours, to activate the isoelectronic-trap-forming impurities in the semiconductor region 106.

Figure 7I:
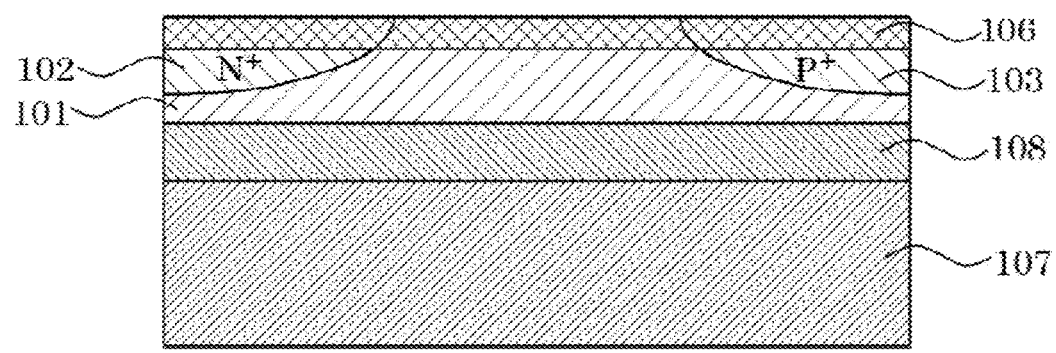
FIG. 7I is a diagram (9) illustrating an example of s step of manufacturing a tunneling field-effect transistor.

Next, the protective oxide film 110 is removed using a dilute hydrofluoric acid (DHF) having a concentration of 1% (see FIG. 7I).

Next, the resultant is washed with a SC2 washing liquid (a mixture liquid of HCl and $H_2O_2$) under temperature conditions of 80° C. for 5 minutes.

Next, $HfO_2$ is deposed by an ALD method under temperature conditions of 250° C., to form a gate insulating film 104 having a thickness of 2.4 nm over the semiconductor region 106. This thickness of the gate insulating film 104 corresponds to an equivalent $SiO_2$ thickness (EOT: Equivalent Oxide Thickness) of 1 nm.

Figure 7J:
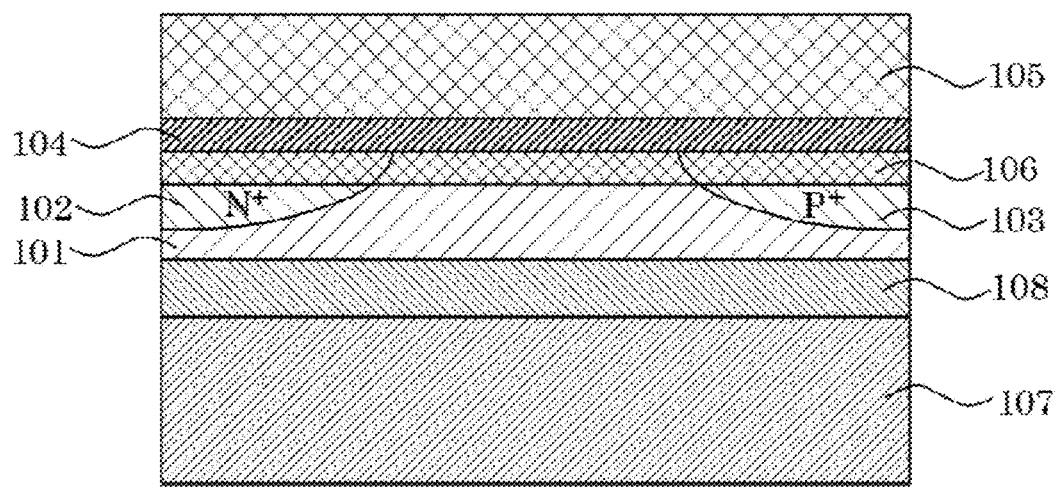
FIG. 7J is a diagram (10) illustrating an example of a step of manufacturing a tunneling field-effect transistor.

Next, layers of TaN (with a thickness of 10 nm) and poly-Si (with a thickness of 50 nm) are formed over the gate insulating film 104 by a sputtering method to form a gate electrode 105 having a layered structure having a thickness of 60 nm (see FIG. 7J).

Figure 7K:
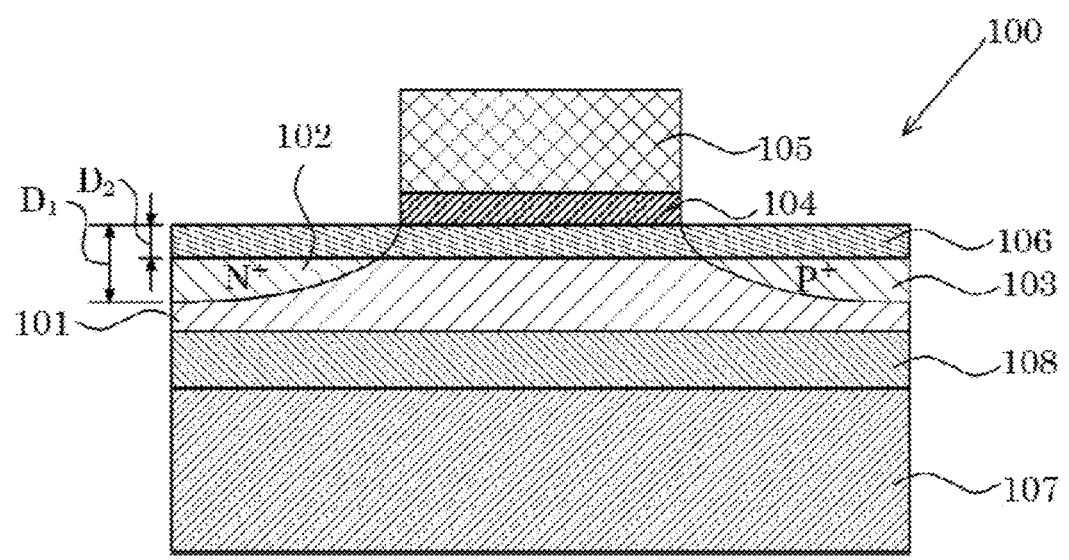
FIG. 7K is a diagram (11) illustrating an example of a step of manufacturing a tunneling field-effect transistor.

Next, the gate insulating film 104 and the gate electrode 105 are patterned by a lithography process using a mask (see FIG. 7K).

In the way described above, a tunneling field-effect transistor 100 is manufactured.

This tunneling field-effect transistor 100 and the tunneling field-effect transistor 10 (see FIG. 5) described above are different in the forming depth down to which the semiconductor region (semiconductor region 6 or 106) containing the isoelectronic-trap-forming impurities is formed as measured from the interface between the gate insulating film and the channel region. In the tunneling field-effect transistor 100, the forming depth down to which the semiconductor region 106 is formed with respect to the source region 102 reaches only halfway through the entire source region 102.

Here, the forming depth down to which the source region is formed as measured from the interface between the gate insulating film and the channel region is assumed to be $D_1$. In many cases, the quantum tunneling occurs through the tunnel junction that is formed down to $D_2$ that is shallower than the forming depth $D_1$ when the tunnel junction is between the source region and the channel region.

Therefore, in the tunneling field-effect transistor 100, the forming depth down to which the semiconductor region 106 is formed with respect to the source region 102 is determined at the position $D_2$ shallower than the forming depth $D_1$ down to which the source region is formed (see FIG. 7K).

On the other hand, when the forming depth down to which the semiconductor region 6 is formed with respect to the source region 2 is determined at the position $D_3$ deeper than the forming depth $D_1$ down to which the source region 2 is formed as in the tunneling field-effect transistor 10 (see FIG. 5), there will occur an unnecessary leakage current during an OFF state based on the isoelectronic-trap-forming impurities at a portion of the tunnel junction at the position deeper than $D_2$ that does not contribute to the quantum tunneling.

Hence, in the tunneling field-effect transistor, it is preferable that the forming depth down to which the semiconductor region containing the isoelectronic-trap-forming impurities is formed as measured from the interface between the gate insulating film and the channel region be shallower than the forming depth down to which the source region is formed.

In the tunneling field-effect transistor 20 based on the Schottky junction (see FIG. 6), the forming depth down to which the semiconductor region 26 containing the isoelectronic-trap-forming impurities is formed is the same as the thickness of the source electrode 22. However, it is preferable that the forming depth down to which the semiconductor region containing the isoelectronic-trap-forming impurities is formed as measured from the interface between the gate insulating film and the channel region be shallower than the depth equivalent to the thickness of the source electrode, as in the tunneling field-effect transistors 10 and 100 based on the pn junction.

(Semiconductor Integrated Circuit)

A semiconductor integrated circuit of the present invention includes the semiconductor element of the present invention.

A method for integrating the semiconductor element is not particularly limited, and an arbitrary method may be selected according to the purpose. A known method may be appropriately employed.

EXAMPLES

Example 1

A tunneling field-effect transistor of Example 1 for simulation was assumed based on the configuration of the tunneling field-effect transistor 100 illustrated in FIG. 7K. In this tunneling field-effect transistor, it was assumed that the thickness of a SOI layer forming a channel region 101 was 45 nm, a gate insulating film 104 was formed by providing a $HfO_2$ layer having a thickness of 2.0 nm over a SiN layer having a thickness of 0.7 nm, a metal layer having a work function of 4.7 eV was formed to have a thickness of 60 nm as a gate electrode 105, and a $SiO_2$ insulating layer as a BOX layer was formed to have a thickness of 145 nm.

Further, it was assumed that an N-type source region 102 had an impurity distribution that would be obtained when ion implantation using As was performed at an acceleration energy of 5 keV at a dose of $2\times10^{15}$ $cm^{-2}$, and a P-type drain region had an impurity distribution that would be obtained when ion implantation using $BF_2$ was performed at an acceleration energy of 5 keV at a dose of $2\times10^{15}$ $cm^{-2}$.

Furthermore, it was assumed that a semiconductor region 106 containing isoelectronic-trap-forming impurities was formed by performing ion implantation of Al at an acceleration energy of 15 keV at a dose of $5\times10^{13}$ $cm^{-2}$ and performing ion implantation of N at an acceleration energy of 15 keV at a dose of $5\times10^{13}$ $cm^{-2}$.

Comparative Example 1

As a tunneling transistor of Comparative Example 1 to be compared with the tunneling field-effect transistor of Example 1, a tunneling transistor having the same configuration as that of the tunneling field-effect transistor of Example 1 except that the semiconductor region 106 containing isoelectronic-trap-forming impurities was not formed was assumed.

Before a comparative simulation of tunneling currents of the tunneling field-effect transistor of Example 1 and the tunneling electric field transistor of Comparative Example 1, light emission was measured from a Si wafer containing isoelectronic-trap-forming impurities and a reference Si wafer free of isoelectronic-trap-forming impurities, to obtain a transition probability at which carriers would transition from a conduction band to a valence band.

That is, the transition probability to be used for the simulation was obtained by measuring emission intensity, because the transition probability was proportional to the emission intensity.

Information about this transition probability was obtained based on a ratio between the transition probabilities of the Si wafer containing the isoelectronic-trap-forming impurities and the reference Si wafer.

Here, as reported in the reference document identified below, under conditions free of the isoelectronic-trap-forming impurities, a tunneling current is considered to occur based on transition via TA phonons. Therefore, a ratio among light emission via TA phonons in the Si wafer containing the isoelectronic-trap-forming impurities, indirect-transition-based light emission via TA phonons in the reference Si wafer, and light emission by the isoelectronic-trap-forming impurities was obtained based on the light emission measurement mentioned above, and the ratio between the transition probabilities was obtained based on this emission intensity ratio.

Reference document: Rigorous theory and simulified model of the band-to-band tunneling in silicon A. Schenk, Solid-State Electronics 36, 19-34 (1993)

The Si wafer containing the isoelectronic-trap-forming impurities was a product obtained by performing ion implantation of Al at an acceleration energy of 15 keV at a dose of $5\times10^{13}$ cm$^{-2}$ and then ion implantation of N at an acceleration energy of 15 keV at a dose of $5\times10^{13}$ cm$^{-2}$ into a Si wafer having a thickness of 525 μm and then annealing the resultant at 450° C. for 60 hours. The reference Si wafer was a Si wafer free of the isoelectronic-trap-forming impurities and having a thickness of 525 μm.

The Si wafer containing the isoelectronic-trap-forming impurities and the reference Si wafer were irradiated with exciting light, which was green laser light having a wavelength of 532 nm, under temperature conditions of 10 K, to cause the Si wafer containing the isoelectronic-trap-forming impurities and the reference Si wafer to emit light. The emission spectra obtained here are plotted in FIG. 8.

Figure 8:
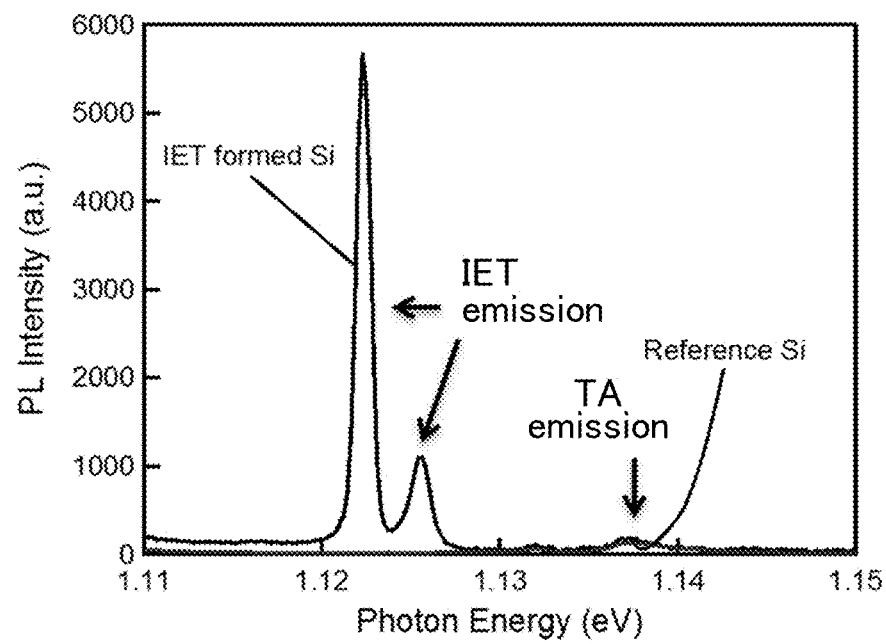
FIG. 8 is a graph plotting emission spectra obtained when a Si wafer containing isoelectronic-trap-forming impurities and a reference Si wafer are caused to emit light.

As plotted in FIG. 8, there were emission peaks that were not observed from the reference Si wafer (Reference Si) but were observed from the Si wafer containing the isoelectronic-trap-forming impurities (IET formed Si). These emissions were considered to be emissions by the isoelectronic-trap-forming impurities (IET emission). Emission peaks that were observed from both of the Si wafer containing the isoelectronic-trap-forming impurities (IET formed Si) and the reference Si wafer (Reference Si) were considered to be emissions by TA phonons (TA emission).

Here, as for the peak areas of the respective emission peaks plotted in FIG. 8, the peak area of the reference Si wafer (Reference Si) and the peak area of the Si wafer containing the isoelectronic-trap-forming impurities (IET formed Si) were at a ratio of 1:27. It can be estimated that the Si wafer containing the isoelectronic-trap-forming impurities had a transition probability that was twenty-seven times higher than that of the reference Si wafer.

Based on this result, a comparative simulation of tunneling currents of the tunneling field-effect transistor of Example 1 and the tunneling electric field transistor of Comparative Example 1 was performed. That is, the comparative simulation of tunneling currents was performed based on that the tunneling probability of the tunneling field-effect transistor of Example 1 was twenty-seven times higher than that of the tunneling electric field transistor of Comparative Example 1. The result is plotted in FIG. 9.

Figure 9:
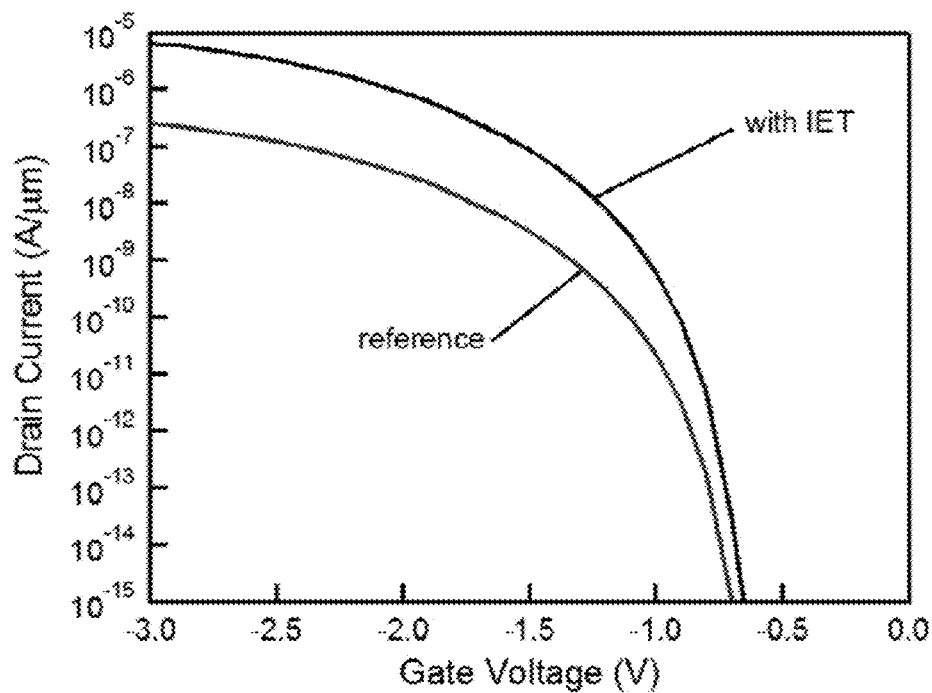
FIG. 9 is a graph plotting results of a comparative simulation of tunneling currents of a tunneling field-effect transistor of Example 1 and a tunneling electric field transistor of Comparative Example 1.

As plotted in FIG. 9, it can be seen that the tunneling field-effect transistor of Example 1 (with IET) obtained a tunneling current higher than that of the tunneling electric field transistor of Comparative Example 1 (reference).

Example 2

A tunneling diode of Example 2 was manufactured in a manner described below, in order to further experimentally prove intensification of a tunneling current by the isoelectronic-trap-forming impurities.

First, a Si substrate over which a device region was defined by element isolation based on LOCOS (Local Oxidation of Silicon) and that had a SiO$_2$ thermally-oxidized protective film having a thickness of 10 nm over the element region was prepared. The Si layer of this Si substrate was doped with a P-type impurity at a concentration of $2\times10^{18}$ cm$^{-3}$ as a P-type semiconductor layer.

Next, the protective film formed over the element region of the Si substrate was removed by a chemical treatment for 10 minutes with a dilute hydrofluoric acid (DHF) having a concentration of 1%.

Next, a hydrogen annealing treatment was performed under a hydrogen atmosphere at 800° C. for 1 hour in order to remove residual oxygen remaining over the surface of the Si layer exposed by the chemical treatment.

Next, CVD using a SiH$_3$ gas under temperature conditions of 500° C. was performed over the Si substrate after the hydrogen annealing treatment, to form a Si epitaxially-grown layer to have a thickness of 30 nm. Simultaneously, a PH$_3$ gas was flowed to incorporate an impurity into the epitaxially-grown layer while the epitaxially-grown layer was being formed, to thereby form an N-type semiconductor layer made of the epitaxially-grown layer doped with phosphorus at an impurity concentration of $2\times10^{20}$ cm$^{-3}$.

Next, from above the N-type semiconductor layer, ion implantation of Al was performed at an acceleration energy of 15 keV at a dose of $5\times10^{13}$ cm$^{-2}$ and then ion implantation of N was performed at an acceleration energy of 15 keV at a dose of $5\times10^{13}$ cm$^{-3}$, to incorporate Al and N as the isoelectronic-trap-forming impurities in a manner to cross-border the interface between the P-type semiconductor layer and the N-type semiconductor layer.

Next, low-temperature annealing was performed under a nitrogen atmosphere at 450° C. for 60 hours to form an impurity level of these impurities.

Next, an Al surface electrode layer was formed by a sputtering method to have a thickness of 200 nm over the N-type semiconductor layer.

Next, the N-type semiconductor layer and the surface electrode layer deposited over the protective film were selectively etched out by photolithography and RIE (Reactive Ion Etching), to fabricate the N-type semiconductor layer and the surface electrode layer to be formed over the device region of the P-type semiconductor layer.

Finally, an Al back electrode layer was formed by a sputtering method to have a thickness of 200 nm over a surface of the Si substrate at a side opposite to the side at which the surface electrode layer was formed, to thereby manufacture the tunneling diode of Example 2.

Comparative Example 2

For comparison of diode characteristics with the tunneling diode of Example 2, a tunneling diode of Comparative Example 2 was manufactured in the same manner as for manufacturing the tunneling diode of Example 2, except that the isoelectronic-trap-forming impurities were not incorporated and the low-temperature annealing was not performed.

Figure 10:
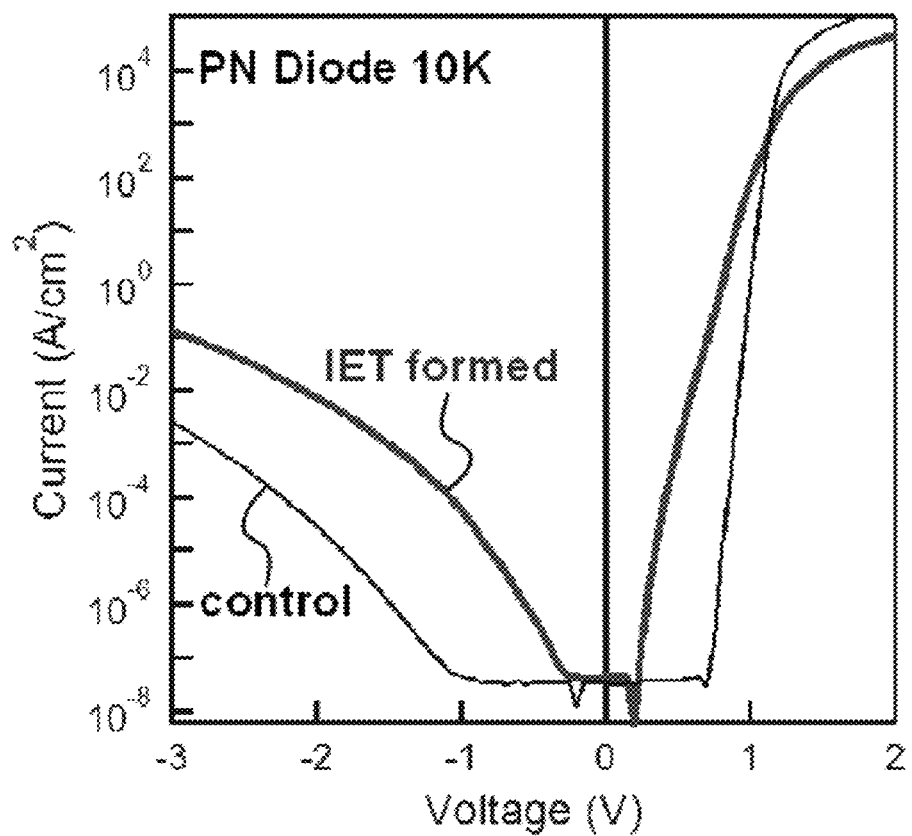
FIG. 10 is a graph plotting measurements of I-V characteristics of tunneling diodes of Example 2 and Comparative Example 2.

FIG. 10 plots measurements of I-V characteristics of the tunneling diodes of Example 2 and Comparative Example 2.

As plotted in FIG. 10, according to the I-V characteristic of the tunneling diode of Comparative Example 2 ("control" in the graph), it was confirmed that a current (tunneling current) flowed based on quantum tunneling even when a reverse voltage was applied. As for a tunneling current, according to the I-V characteristic of the tunneling diode of Example 2 ("IET formed" in the graph), a tunneling current having values greater by about two digits than the tunneling current of the tunneling diode of Comparative Example 2 was confirmed when compared based on the reverse voltage.

This indicates that incorporation of the isoelectronic-trap-forming impurities could intensify the tunneling current.

Hence, by incorporation of the isoelectronic-trap-forming impurities, the semiconductor element of the present invention can obtain a high tunneling current.

FIG. 10 plots higher current values for the tunneling diode of Comparative Example 2 where relatively high forward voltages were applied. This is because a resistance value increased in the tunneling diode of Example 2 because the impurity concentrations of the carriers decreased due to implantation defect during ion implantation of the isoelectronic-trap-forming impurities.

The measurement of the I-V characteristics and the measurement of the emission intensity relating to the simulation test described above were performed under temperature conditions of 10 K. When there is the defect, measurements under temperature conditions such as room temperature would result in intensification of the tunneling current based on influence of the implantation defect. Therefore, from the viewpoint of focusing only on influence of the isoelectronic-trap-forming impurities, the measurements were performed at a sufficiently low temperature at which the measurements would not receive the influence. Therefore, the semiconductor device of the present invention can be used under temperature conditions such as room temperature.

Further, the influence of the implantation defect was not eliminated from the tunneling diode of Example 2 for the purpose of comparison. However, it is possible to easily eliminate the influence of the implantation defect by performing an annealing treatment or the like at an appropriate temperature.

Example 3

In order to supplement the results of the above-described simulation about the tunneling field-effect transistor and further experimentally prove intensification of a tunneling current by the isoelectronic-trap-forming impurities, a tunneling field-effect transistor of Example 3 was manufactured and the effect thereof was verified.

Here, the tunneling field-effect transistor of Example 3 was manufactured in the same manner as the P-type tunneling field-effect transistor 100 described above (see FIG. 7A to FIG. 7K), and by being provided with a drain electrode and a source electrode, configured as an element structure of an N-type behavior tunneling field-effect transistor in which the source region 102 operated as a drain region and the drain region 103 operated as a source region.

Comparative Example 3

For comparison of transistor characteristics with the tunneling field-effect transistor of Example 3, a tunneling field-effect transistor of Comparative Example 3 was manufactured in the same manner as the tunneling field-effect transistor of Example 3, except that the step of forming the semiconductor region 106 containing the isoelectronic-trap-forming impurities (see FIG. 7H) was skipped, and the subsequent activating annealing for the semiconductor region 106 was not performed.

Figure 11:
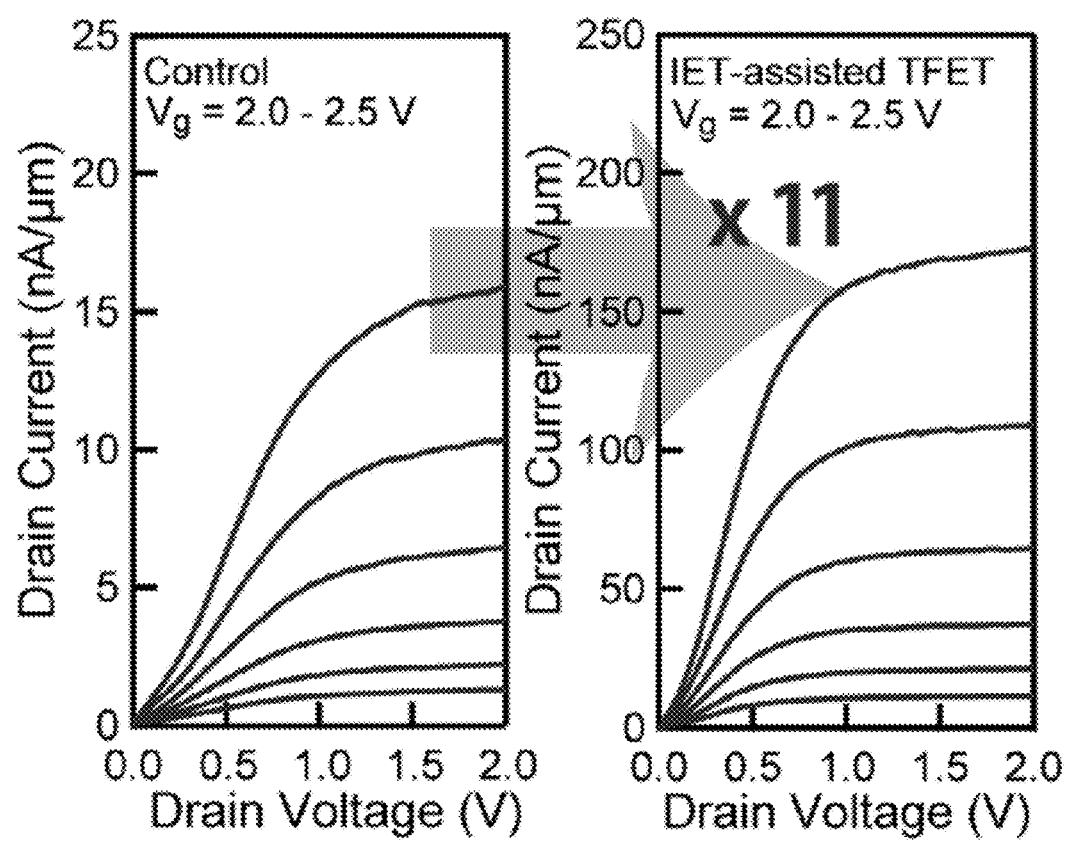
FIG. 11 is a graph plotting measurements of drain voltage-drain current characteristics of tunneling field-effect transistors of Example 3 and Comparative Example 3.

FIG. 11 plots measurements of drain voltage-drain current characteristics of the tunneling field-effect transistors of Example 3 and Comparative Example 3. FIG. 11 plots the measurement of the drain voltage-drain current characteristic of the tunneling field-effect transistor of Comparative Example 3 on the left (control), and the measurement of the drain voltage-drain current characteristic of the tunneling field-effect transistor of Example 3 on the right (IET-assisted TFET).

The drain voltage-drain current characteristic was measured six times in total by varying the gate voltage ($V_g$) from 2.0 V through 2.5 V at 0.1 V intervals. As plotted in FIG. 11, in any of these cases, the tunneling field-effect transistor of Example 3 obtained a drain current higher than that of the tunneling field-effect transistor of Comparative Example 3, and the difference between the drain currents was as high as about eleven times.

Figure 12:
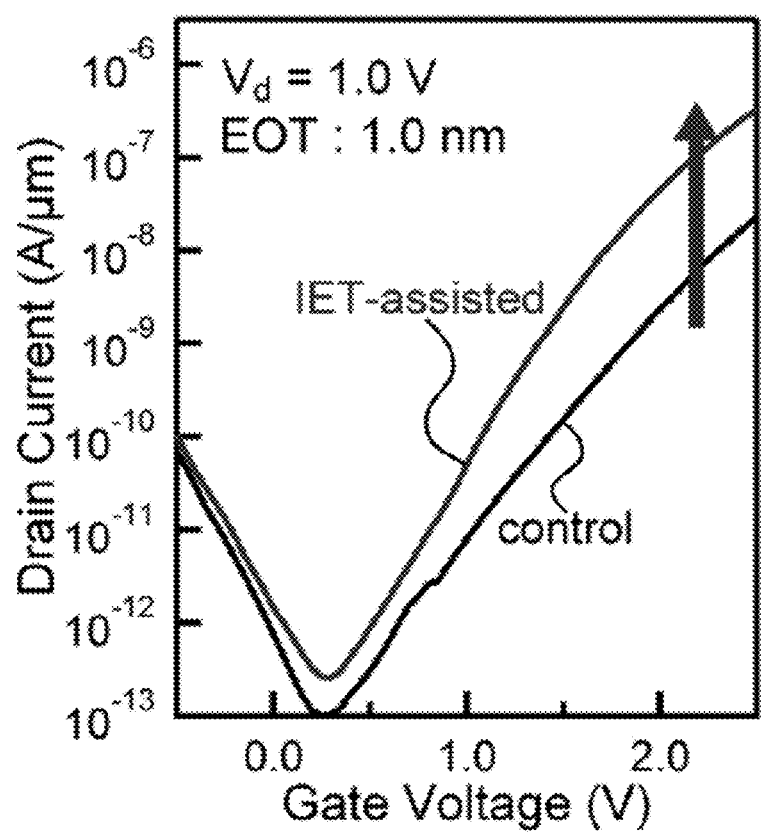
FIG. 12 is a graph plotting measurements of gate voltage-drain current characteristics of tunneling field-effect transistors of Example 3 and Comparative Example 3.

FIG. 12 plots measurements of gate voltage-drain current characteristics of the tunneling field-effect transistors of Example 3 and Comparative Example 3. This measurement was performed at a drain voltage ($V_d$) of 1.0 V.

As plotted in FIG. 12, as the gate voltage increased in the positive direction, the drain current of the tunneling field-effect transistor of Example 3 shifted to exhibit values that became gradually higher than the values of the drain current of the tunneling field-effect transistor of Comparative Example 3, and the difference between the drain currents was higher than ten times at a maximum.

From the measurements plotted in FIG. 11 and FIG. 12, it was confirmed that drain currents (tunneling currents) flowed in the tunneling field-effect transistors of Example 3 and Comparative Example 3 based on quantum tunneling, and that the magnitude of the current could be intensified by incorporation of the isoelectronic-trap-forming impurities.

REFERENCE SIGNS LIST 1, 21, 101 channel region
2, 102 source region
3, 103 drain region
4, 24, 104 gate insulating film
5, 25, 105 gate electrode
6, 26, 106, $T_1$, $T_2$ semiconductor region containing isoelectronic-trap-forming impurities
10, 20, 100 tunneling field-effect transistor
22 source electrode
23 drain electrode
28 insulating substrate
107 Si layer for handling
108 $SiO_2$ insulating layer
110 protective oxide film
111a, 111b resist layer

The invention claimed is:

1. A semiconductor element, comprising:
a tunnel junction, wherein a whole or a part of the tunnel junction is constituted by a semiconductor region made of an indirect-transition semiconductor that comprises isoelectronic-trap-forming impurities.

2. The semiconductor element according to claim 1, wherein the indirect-transition semiconductor is silicon, germanium, or a mixed crystal of silicon and germanium.

3. The semiconductor element according to claim 2, wherein the indirect-transition semiconductor is silicon, and the isoelectronic-trap-forming impurities are Al and N.

4. The semiconductor element according to claim 1, wherein the tunnel junction is constituted by a PN junction.

5. The semiconductor element according to claim 1, wherein the tunnel junction is constituted by a Schottky junction.

6. The semiconductor element according to claim 1, wherein the semiconductor element comprises an element structure of a tunneling field-effect transistor in which a whole or a part of a tunnel junction is constituted by a semiconductor region made of an indirect-transition semiconductor that comprises isoelectronic-trap-forming impurities.

7. A method for manufacturing a semiconductor element, comprising:

forming a semiconductor region made of an indirect-transition semiconductor into which isoelectronic-trap-forming impurities are incorporated, such that the semiconductor region constitutes a whole or a part of a tunnel junction of the semiconductor element.

8. A semiconductor integrated circuit, comprising:

a semiconductor element that comprises a tunnel junction, wherein a whole or a part of the tunnel junction is constituted by a semiconductor region made of an indirect-transition semiconductor that comprises isoelectronic-trap-forming impurities.

9. The method for manufacturing the semiconductor element according to claim 7, wherein the indirect-transition semiconductor is silicon, germanium, or a mixed crystal of silicon and germanium.

10. The method for manufacturing the semiconductor element according to claim 7, wherein the indirect-transition semiconductor is silicon, and the isoelectronic-trap-forming impurities are Al and N.

11. The method for manufacturing the semiconductor element according to claim 7, wherein the tunnel junction is constituted by a PN junction.

12. The method for manufacturing the semiconductor element according to claim 7, wherein the tunnel junction is constituted by a Schottky junction.

13. The method for manufacturing the semiconductor element according to claim 7, wherein the semiconductor element comprises an element structure of a tunneling field-effect transistor in which a whole or a part of a tunnel junction is constituted by a semiconductor region made of an indirect-transition semiconductor that comprises isoelectronic-trap-forming impurities.

* * * * *